United States Patent [19]

Fujimura

[11] Patent Number: 4,609,428
[45] Date of Patent: Sep. 2, 1986

[54] METHOD AND APPARATUS FOR MICROWAVE PLASMA ANISOTROPIC DRY ETCHING

[75] Inventor: Shuzo Fujimura, Tokyo, Japan

[73] Assignee: Fujitsu Limited, Kawasaki, Japan

[21] Appl. No.: 756,233

[22] Filed: Jul. 18, 1985

[30] Foreign Application Priority Data

Jul. 23, 1984 [JP] Japan ............... 59-152363

[51] Int. Cl.$^4$ .............. H01L 21/306; B44C 1/22; C03C 15/00; C03C 25/06
[52] U.S. Cl. .................. 156/643; 156/646; 156/345; 204/298; 204/192.32
[58] Field of Search ............. 156/345, 643, 646; 204/192 E, 298; 427/38, 39; 118/728, 50.1, 620; 134/1

[56] References Cited

U.S. PATENT DOCUMENTS 4,123,316 10/1978 Tsuchimoto .......... 156/646
4,512,868 4/1985 Fujimura et al. ..... 156/345 X

FOREIGN PATENT DOCUMENTS 54-22778 2/1979 Japan .................. 156/643

OTHER PUBLICATIONS

Guarnieri et al., RF Ion Source, IBM Technical Disclosure Bulletin, vol. 24, No. 11B, Apr. 1982, pp. 5833-5835.
Miyamura et al., A 26-cm Electron-Cyclotron-Resonance Ion Source for Reactive Ion Beam Etching of $SiO_2$ and Si, J. Vac. Sci., Technol., 20(4), Apr. 1982, pp. 986-988.

Primary Examiner—William A. Powell
Attorney, Agent, or Firm—Staas & Halsey

[57] ABSTRACT

A microwave plasma etching method and apparatus for performing substantially anisotropic etching to form micropatterns on IC substrates. A microwave power source creates a plasma from a gas with a relatively low pressure such as $10^{-3}$ to $10^{-4}$ Torr, so that the mean free path of the gas molecules exceeds the dimensions of the etching apparatus. A magnetic field is generated in a plasma generating chamber, a reaction chamber where in the substrate is mounted and a connecting chamber. The plasma discharge is enhanced by a cyclotron resonance magnetic field intensity corresponding to the frequency of the microwave power applied to the plasma chamber. The magnetic field creates a magnetic mirror which prevents the electrons in the plasma from entering into the reaction chamber so as to eliminate the generation of free radicals in which the reaction chamber which adversely affect the anisotropic etching ability.

24 Claims, 6 Drawing Figures

METHOD AND APPARATUS FOR MICROWAVE PLASMA ANISOTROPIC DRY ETCHING

BACKGROUND OF THE INVENTION

The present invention relates to a method and apparatus for performing microwave plasma anisotropic dry etching. More particularly, it relates to a microwave plasma processing apparatus having an improved anisotropic etching capability and processing rate for etching or ashing integrated circuit semiconductor (IC) substrates.

In fabrication processes for forming fine patterns in IC devices, etching processes are becoming increasingly important. From the beginning of the IC industry, "wet" or chemical etching methods have been employed, but recently "dry" etching methods, such as plasma etching methods, have been adopted. Dry etching processes have various advantages, as compared with other etching methods including, for example, the capability to provide high resolution, less under-cutting, the elimination of fabricating steps such as wafer handling for rinsing and drying, and inherent cleanliness. Importantly, plasma etching makes it possible to obtain extremely fine pattern resolution on the sub-micron order and to perform sequential etching and stripping operations using the same machine, thus making it possible to have a fully automated process for fabricating an IC.

A plasma is a highly ionized gas containing a nearly equal number of positively and negatively charged particles (electrons and positive or negative ions) plus free radicals. The ions are utilized for etching in a sputtering process, which is essentially a physical etching, and the free radicals are utilized for chemical etching. Free radicals are chemically activated, electrically neutral atoms or molecules which can actively form chemical bonds when in contact with other materials, and are utilized in a plasma etching process as a reactive species which chemically combines with materials to be etched. The gas and the material to be etched are selected so that the free radicals combine with the material to form a volatile compound which is removed from the system by an evacuating device. Consequently, an etching method utilizing free radicals is essentially chemical etching.

Usually, a plasma etching apparatus comprises a plasma generating device, a reacting region (reaction chamber) and an exhausting device.

The basic requirements for plasma etching of an IC substrate are a high etching rate, anisotropic etching accompanied by reduced side etching, and less damage to the substrate due to ion or electron bombardment, radiation by ultraviolet rays, and the like. Recently, in accordance with a demand for high density packaging and high speed signal processing capability of ICs, it has become necessary to form increasingly fine and precise etching patterns on IC substrates. For example, so-called micro-patterns—e.g., wiring patterns having sub-micron dimensions, such as a width of 0.5 to 0.8 μm—are required. To achieve such accuracy for precise micro-patterns, a plasma etching method and apparatus having the capability to perform highly anisotropic etching provided by a high controllability of the directions of radicals and ions, is considered a key technology. With an anisotropic etching method, functional particles, namely ions and free radicals, must be controlled to impinge substantially perpendicularly on the surface of an IC substrate, which is covered with a patterned lithographic mask of photoresist material or silicon nitride. Since the etching process is carried out perpendicularly to the exposed surface of the substrate, side etching or undercutting of the patterned layer is reduced and the etched pattern has dimensions which are sufficiently accurate to form fine patterns of a sub-micron order with high reproducibility.

The advantages and disadvantages of conventional technologies are surveyed briefly. With an ion etching process, ions generated in a plasma are accelerated by an electric field and impact the exposed surface of a substrate to be processed, thereby to remove the material of the substrate by their kinetic energy. The electric field is usually applied by an external electric source. The direction of movement of the ions is controlled by the applied electric field, resulting in anisotropic etching regardless of the gas pressure. In addition, a high etching rate is obtained with a high accelerating potential and high gas pressure. However, ions of relatively high energy tend to damage portions of the substrate near the portions of the substrate undergoing etching. For example, photoresist material used as a mask may be carbonized by the ion bombardment. Further, fine wiring conductors formed of doped polysilicon may be damaged, and metal members of the etching apparatus which are bombarded by the ions are sputtered onto the substrate undergoing etching, thereby contaminating the substrate. These damaging effects can be eliminated by the use of a low accelerating energy.

When a low accelerating energy is used for ion etching the substrate is mounted in and electrically isolated from the apparatus, and exposed to the plasma. Thus, the substrate is electrically floated and negatively charged with respect to the plasma, resulting in the formation of an ion sheath in front of the substrate undergoing processing. The ion sheath is created because of the difference between the velocity of electrons and that of ions in the plasma. A potential drop, referred to as a floating potential, is generated across the ion sheath—the floating potential being approximately 20 V. However, with low accelerating energy etching, the etching rate is reduced.

On the other hand, plasma etching utilizing free radicals is entirely free from the disadvantages and damages caused by sputtering. Unfortunately, the direction in which the radicals impact the substrate is not controllable by an electric field because the radicals are not electrically charged. When plasma etching is conducted in a relatively high gas pressure such as 10 to $10^{-1}$ Torr, the mean free path of the gas molecules is short, e.g., $5 \times 10^{-2}$ to $5 \times 10^{-4}$ cm, resulting in multiple collisions of the molecules and causing the molecules to move in random directions. Chemical etching (or so-called "after glow etching") using a high gas pressure is not suitable for anisotropic etching because the free radicals have random motion and do not strike the substrate perpendicularly.

In order to eliminate the random motion of the radicals and to conduct satisfactory anisotropic etching, a longer mean free path of the gas molecules, far exceeding the dimensions of the etching apparatus, is necessary. A longer mean free path can be provided by a lower gas pressure, e.g., approximately $10^{-4}$ Torr. In this case, the mean free path of the gas molecules is relatively long, approximately 50 cm, in comparison with the corresponding dimension of the etching device. If the initial direction of the radicals is limited by a geometrical shielding structure similar to an aperture or shield, the radicals ejected from a plasma in a given direction continue in that direction until they impact the substrate. Therefore, the shielding structure is designed to select radicals having a favored initial direction. However, a reduction of the etching rate is inevitable since the number of free radicals which impact the substrate is lowered. In order to clarify the problems described above, some typical prior art etching apparatus and technologies are described in the following.

FIG. 1 is a schematic cross-sectional view of a reactive ion etching (RIE) apparatus, illustrating the structure and the fundamental operating principle of a conventional RIE apparatus. A pair of electrodes 2 and 3 are arranged in parallel in a vacuum tight vessel 12. The vessel is evacuated by an exhausting pump system (not shown) through an exhausting tube 14, as indicated by an arrow EX, and gas is fed to the vessel through a feeding tube 13. Workpieces (IC substrates) 1 to be etched are mounted on a quartz tray 7 arranged on the electrode 2 and radio frequency power of 13.75 GHz frequency is applied to the electrode 2, which is electrically isolated from ground. Thus, a plasma discharge 5 is generated between electrodes 2 and 3. Since the workpieces or substrates 1 are isolated by an insulator 9, a cathode wall or ion sheath 6 is formed in front of the electrode 2. Ions 4, generated in the plasma 5, are accelerated by an electric field generated within the ion sheath 6, impinge the substrates 1 with an energy of approximately 100 eV, and etch the surfaces of the substrates 1. A ground shield 8 shields the electrode 2 to stabilize the plasma. The ions are guided by the electric field inside the ion sheath 6 to impact the substrate 1 substantially perpendicularly to the surface, thus realizing substantially anisotropic etching. However, damage due to ion sputtering is inevitable.

In another plasma etching method utilizing plasma ions, referred to as a reactive ion beam etching (RIBE), ions are extracted from a plasma by a strong static electric field to impact the substrates to be etched. A plasma etching apparatus referred to as an "ion shower," proposed by Matsuo et al., is a typical RIBE apparatus and is disclosed in Japanese laid open patent publication No. 55-141729. However, the energy of the ions in the ion shower is approximately 500 to 1000 eV, which causes sputtering damage, as discussed above.

In order to overcome the problems associated with sputtering, various apparatus have been proposed, such as a chemical dry etching (CDE) apparatus disclosed in U.S. Pat. No. 4,192,1980—Horiike et al. In CDE apparatus, gas pressures as high as 10 to $10^{-1}$ Torr and the presence of neutral radicals moving in random directions result in isotropic plasma etching which fails to form precise and fine micro-etching patterns.

A rather low gas pressure of approximately $10^{-3}$ to $10^{-4}$ Torr is employed in certain anisotropic plasma etching apparatus. In one such anisotropic plasma etching apparatus, reported in an article entitled "Low Energy Ion Beam Etching," by H. R. Kaufman et al., J. Electrochem. Soc., Vol. 128, No. 5, May 1981, the substrates are mounted on an insulator which is electrically isolated from the system, resulting in the creation of an ion sheath having a floating potential with a voltage drop of approximately 20 V; the ions generated in the plasma are accelerated by the relatively small floating potential of the ion sheath, resulting in little damage to micro-patterns formed on the IC substrate. Further, the gas pressure is kept rather low—approximately 0.8 to $4 \times 10^{-4}$ Torr. The thickness of the ion sheath formed in front of the substrate is much smaller than the mean free path of the ions in the plasma, and thus the ions move through the ion sheath without colliding with other ions or molecules. Since the ions are guided by the electric field inside the ion sheath, almost all the ions strike the workpiece at an angle which is normal to the surface of the workpiece. Accordingly, this plasma etching method is effective to obtain precise micro-patterns. The etching is considered to be performed by a combination of the radicals and ions, which is referred to by the author as an "enhanced chemical etching". However, since the floating potential is utilized to accelerate the ions, the etching rate is very small and thus this apparatus is not suitable for practical use.

Another etching apparatus utilizing low energy ions is reported by Suzuki et al. in an article titled "The roles of Ions and Neutral Active Species in Microwave Plasma Etching," J. Electrochem. Soc. Vol. 126, No. 6, June 1979. The apparatus is referred to as a "magneto-microwave plasma etching apparatus" by the author, because the apparatus has a plasma discharging chamber disposed in a magnetic field. A 2.45 GHz microwave is fed through a wave guide to the plasma chamber, and a magnetic field is generated in the plasma chamber using solenoids and a permanent magnet. A low pressure gas, such as $CF_4$ at $5 \times 10^{-4}$ Torr, is fed into the plasma chamber and the microwave energy causes the gas to discharge, generating a plasma. The magnetic field is utilized to drive the electrons in the plasma in a Raman motion (cyclotron motion), increasing the number of collisions in the gas molecules to achieve a higher ionization efficiency. Thus, even with a low gas pressure, a sufficient number of ions are obtained. The magnetic field is a mirror-type magnetic field having a peak magnet field intensity, namely, a mirror peak, located at the opposite side of the plasma from a substrate to be etched. The mirror peak serves to confine the plasma and faces in the direction of propogation of the microwave energy. The magnetic mirror, however, does not reflect or suppress electrons and thus fails to prevent the electrons in the plasma from striking the substrate which is electrically floated and exposed to the plasma. Accordingly, plasma screening equipment is provided to restrict exposure of the substrate to the plasma. The screening equipment includes four tungsten mask electrodes. The first electrode (ground potential) determines the plasma potential; the second electrode extracts ions from the plasma and suppresses electrons; the third electrode suppresses ions; and the fourth electrode has the same electrical potential as the substrate. The accelerating energy of the ions is approximately 20 V, as described with respect to the Kaufman et al. apparatus, and etching is performed in an anisotropic manner. However, the screening equipment reduces the etching rate and since the plasma screening equipment is extremely close to the substrate, the electrons generated in the plasma can travel to a region in the plasma which is close to the substrate. These electrons collide with neutral, non-ionized gas molecules (not radicals), ionize the neutral molecules and create additive radicals which travel in random directions causing side etching and reducing the anisotropic etching capability of the apparatus. In addition, when the electrons from the plasma impinge onto the substrates, the kinetic energy of the electrons is converted into heat, elevating the temperature of the substrate. If the substrate to be etched is covered with a photoresist layer, a problem is introduced, in that the temperature elevation of the substrate softens the photoresist mask and reduces the dimensional accuracy of the etching.

Another example of a low energy plasma etching apparatus, developed by Akitani, is reported in the publication titled "Directional Dry Etching of Silicon by a Reactive Nozzle-Jet" presented at the Third Dry Process Symposium, held on Oct. 26-27, 1981, in Tokyo. In this apparatus, a free jet of radicals generated at a gas pressure of approximately 0.1 to 1.0 Torr is ejected from an aerodynamic nozzle system. A free-expansion process occurs as the radicals pass from the nozzle to a vacuum at a pressure of approximately $10^{-4}$ to $10^{-5}$ Torr. The free-expansion process collimates the direction of the motion of the radicals, which initially have random motion. The collimated direction of the radicals enables the radicals to impinge on the surface of the substrate with a low energy a nearly normal direction. Although this apparatus forms satisfactory precise micro-patterns on a substrate, the etching rate is very small, due to the extremely small nozzle diameter; thus, the apparatus is not suitable for practical use.

Accordingly, it has been necessary to develop a substantially anisotropic microwave plasma etching apparatus having a low energy ion etching system and a reasonable etching rate, and which is suitable for practical use.

SUMMARY OF THE INVENTION

It is an object of the present invention to provide a microwave plasma etching apparatus having a substantially anisotropic etching capability which does not damage the substrate undergoing etching.

It is another object of the present invention to provide an anisotropic microwave plasma etching apparatus having relatively low gas pressure and means for preventing electrons generated in the plasma from intruding into the space near a workpiece to be etched, thereby to perform anisotropic etching while preventing the temperature of the substrate from incresing due to the electron bombardment.

To achieve substantially anisotropic etching, for purposes of forming micropatterns of a sub-micron order on an IC substrate, the gas pressure in the apparatus of the present invention is selected to below, approximately $10^{-3}$ to $10^{-4}$ Torr, so that the mean free path of the gas molecules substantially exceedes the dimensions of the apparatus. To protect the mico-patterns formed by the etching process from damage caused by ion bombardment, the accelerating energy of ions generated in the plasma is selected to be as low as possible; particularly, the present invention utilizes a floating potential of approximately 20 V, created by electrically isolating a substrate which is exposed to the plasma. To increase the efficiency of the generation of ions and radicals in the plasma, a magnetic field is utilized to create a cyclotron resonance point and impart a cyclotron motion to the electrons in the plasma, thereby increasing the probability of collisions between the electrons and gas molecules in the plasma.

The magnetic field generating means of the microwave plasma etching apparatus of the present invention also generates a magnetic mirror for preventing the electrons in the plasma from moving into the portion of the plasma near the substrate, where the electrons could collide with and ionize neutral gas molecules, creating new radicals which would have uncontrollable random motion. The magnetic mirror or magnetic shutting means confines the electrons to a plasma generating chamber while allowing the ions and radicals to move toward the substrate which is mounted in a reaction chamber. In particular, the magnetic mirror generating means, such as a solenoid or a permanent magnet, is arranged to reflect the electrons at a peak point of the magnetic mirror so that the electrons are confined to the plasma in the plasma generating chamber.

The magnetic field plays two roles in the present invention. First, it enhances the plasma density by utilizing a cyclotron resonance phenomena. Second, it acts as a magnetic mirror which functions to prevent the electrons from striking the substrate.

A further feature of the present invention is a physical shutting means comprising a connecting chamber connecting the plasma chamber to the reacting chamber. The shape of the inside of the connecting chamber is designed to be similar to an optical aperture so that the impinging angle of the travelling particles is limited to a predetermined angle from the normal by the inner wall of the connecting chamber. Therefore, radicals which are not traveling in a direction perpendicular to the surface of the substrate are shut out or prevented from entering the reaction chamber by the shutting means. As a result, the radicals in the plasma strike the substrate substantially perpendicularly, providing anisotropic etching of the substrate.

A further improvement is achieved by generating the magnetic field with two solenoids spaced apart from each other, thus creating a magnetic field profile having two cyclotron resonance points Pc in the plasma generating chamber and two peak points Pm or magnetic mirrors located at opposite ends of the plasma chamber. As a result, a magentic field having a concave magnetic field intensity profile is created along the axis of the apparatus, thereby preventing particles in the plasma (ions and electrons) from being consumed by impinging on the inner wall of the plasma chamber and leading to an increase in plasma generating efficiency. The magnetic field intensity at the bottom of the concave profile is selected to be slightly lower than magnetic field intensity at the cyclotron resonance points.

These together with other objects, and the details of the advantages and features of the present invention will be apparent from the following description of the embodiments of the present invention reference being made to the accompanying drawings, wherein like reference numerals designate like parts.

DESCRIPTION OF THE PREFERRED EMBODIMENTS

Figure 2A:
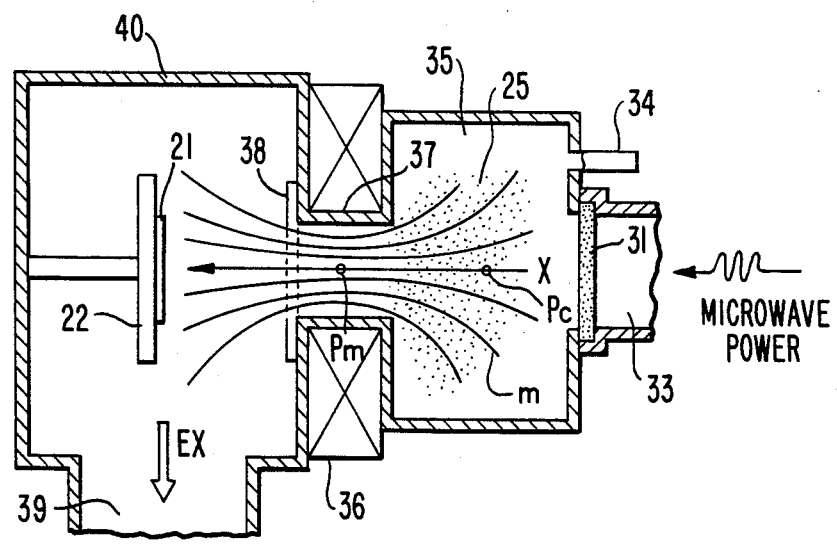
FIG. 2(a) is a schematic cross-sectional view illustrating an emobdiment of the apparatus of the present invention.

FIG. 2(a) is a cross-sectional view of one embodiment of the present invention, illustrating the structure of the apparatus and the etching operation. Microwave energy is supplied to a plasma generating chamber 35 from a microwave power source (not shown) through a microwave guiding means such as a waveguide 33. The wave guide 33 and the plasma chamber 35 are separated from each other by a vacuum-tight window 31 formed of a low loss inductive material such as a high alumina. The window 31 passes the microwave energy and simultaneously forms a part of the plasma chamber 35. A connecting chamber 37 is positioned adjacent to the plasma chamber 35, and a magentic mirror generating means, comprising, e.g., a solenoid 36, surrounds the outside of the connecting chamber 37. The solenoid 36 has, for example, a total of 220 turns, an inner diameter of 100 mm and an axial length of 83 mm. The connecting chamber 37 connects the plasma chamber 35 with a reacting chamber 40, as shown in FIG. 2(a), to form a vaccum vessel. The vacuum vessel is evacuated by an exhausting system (not shown) through an exhausting tube 39.

Figure 2B:
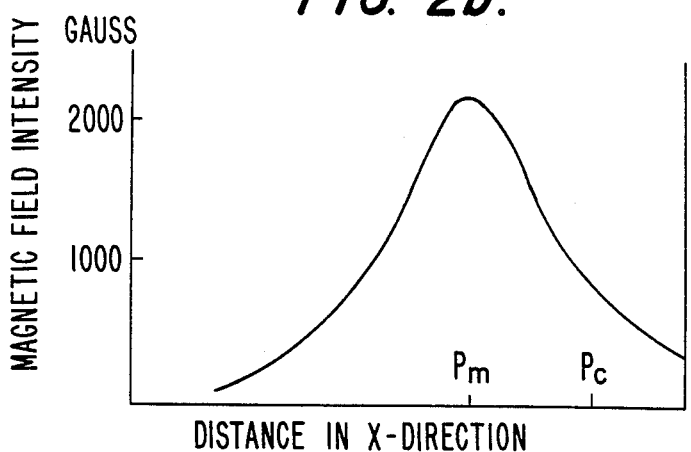
FIG. 2(b) is a diagram of a magnetic field intensity distribution along the X axis of the embodiment shown in FIG. 2(a).

A magnetic mirror is created in the connecting chamber 35 by the solenoid 36. The magnetic field intensity of the magnetic mirror has a convex profile in an X direction, represented by an arrow X in FIG. 2(a). As shown in FIG. 2(b), the magnetic field intensity profile has a low intensity near the window 31. The intensity profile gradually increases, passing a cyclotron resonance point Pc, which has a magnetic intensity of 875 Gauss and causes cyclotron resonance of the particles excited by a microwave energy of 2.45 GHz, and reaches a peak magnetic field intensity of approximately 1.5 to 2.5 KGauss at point Pm and then gradually decreases. As shown in FIG. 2(a), magnetic flux lines m extend through the plasma chamber 35, the connecting chamber 37 and the reaction chamber 40. The cyclotron resonance point Pc is located approximately at the middle portion of the plasma chamber 35 and the peak point Pm is located in the connecting chamber 37.

A workpiece, for example, an IC substrate 21, is placed on a mounting table 22 in the reaction chamber 40. The mounting table 22 is positioned so that the distance from the peak point Pm to the mounting table 22 is smaller than the associated mean free path of the radicals. A shielding filter 38 is disposed between the connecting chamber 37 and the reaction chamber 40. The shielding filter 38 is approximately 5 mm thick and has a plurality of holes of 2 to 3 mm diameter which allow the passage into the reaction chamber 40 of radicals and ions generated in the plasma, but prevents the leakage of microwave power into the reaction chamber 40, as described below. The plasma chamber 35, the connecting chamber 37, the shielding filter 38, reaction chamber 40 and the table 22 are made of a metal, such as aluminum, which is resistant to etching by the radicals.

An anisotropic plasma etching process utilizing the apparatus of the present invention is performed as follows. The vacuum vessel is evacuated to a predetermined vacuum, such as $10^{-5}$ Torr. Subsequently, the plasma chamber 35 is back-filled with fluorine gas (F$_2$) through a gas inlet tube 34 to a predetermined gas pressure, approximately $10^{-4}$ Torr. Microwave energy of approximately 2.45 GHz is propagated through the wave guide 33 into the plasma chamber 35, and simultaneously a convex magnetic field or magnetic mirror is formed by energizing the solenoid 36. The microwave energy creates discharges in the fluorine gas, thereby generating a plasma. The plasma contains a large number of electrons, ions, and radicals which are accelerated and multiplied by the cyclotron resonance phenomena created by the combined application of the microwave energy of 2.45 GHz and a magnetic field of 875 Gauss at the cyclotron resonance point Pc. Thus, a dense cloud of electrons is generated in spite of the relatively low spatial density of the gas. The electrons, radicals, and ions which have a velocity component in the X direction begin to move toward the substrate 21, and since the mean free path of these particles exceeds the combined length of the plasma chamber 35, the connecting chamber 37 and the reaction chamber 40, there is only a small probability of collisions between the particles themselves or between the particles and the walls of the chambers. As the result, the electrons, radicals and ions maintain their initial motion in the plasma—the electrons have a cyclotron motion and the radicals and ions having substantially linear motion.

The electrons also have a component of motion toward the reaction chamber, i.e., an axial velocity. However, the electrons lose their axial velocity due to the gradually increasing magnetic flux density along the axis of the magnetic field, and the axial component of the velocity of the electrons reaches zero and turns to a negative velocity near the peak point Pm of the magnetic field. Consequently, most of the electrons are reflected back toward the plasma chamber 35.

The reflecting efficiency of a magnetic mirror depends on a mirror ratio, which is defined by the ratio of the maximum magnetic field intensity to the minimum field intensity. In the present case, the minimum magnetic field intensity is defined as the magnetic field intensity at the cyclotron resonance point, i.e., 875 Gauss, since the magentic mirror is affecting the electrons generated in the plasma. A ratio of 2 to 3, between the minimum magnetic field intensity and the maximum magnetic field intensity (1.5 to 2.5 KGauss at Pm) is found to provide the highest reflecting efficiency—approximately 90%. Therefore, in general, the mirror ratio of the magnetic mirror should be selected in the range of 2 to 3.

By means of the magnetic mirror described above, most of the electrons generated in the plasma 25 are contained in the plasma generating chamber 35 and prevented from entering into the reaction chamber 40. The neutral radicals and ions in the plasma 25, which do not have cyclotron motion, pass through the magnetic mirror and the shielding filter 38, impinge onto the substrate 21, and react with the material of the substrate 21 to form volatile products which are evacuated from the vacuum vessel by the vacuum system. Thus, anisotropic plasma etching is performed. Since very few of the electrons generated in the plasma 25 reach the reaction chamber 40, the generation, in the reaction chamber 40, of radials having random motion is prevented, ensuring significantly improved anisotropic plasma etching.

The magnetic mirror, having a peak point Pm in the connecting chamber 37 and a cyclotron resonance point Pc in the plasma chamber, functions to generate cyclotron resonance of the electrons to enhance the plasma density and functions as a magnetic reflector to prevent electrons in the plasma from entering the reaction chamber 40.

The connecting chamber 37 not only provides a location for the magnetic mirror, but also plays a role as a limiter or aperture for the neutral radicals. The aperture-like function is provided by the dimensions and the shape of the inner wall of the connecting chamber 37. The higher the ratio of the axial length to the inner width or diameter of the connection chamber 37, the stronger the collimating effect on the radicals, that is, only radicals having directions nearly normal to the surface of the substrate 21 are allowed to impinge on the surface of the substrate.

Figure 1:
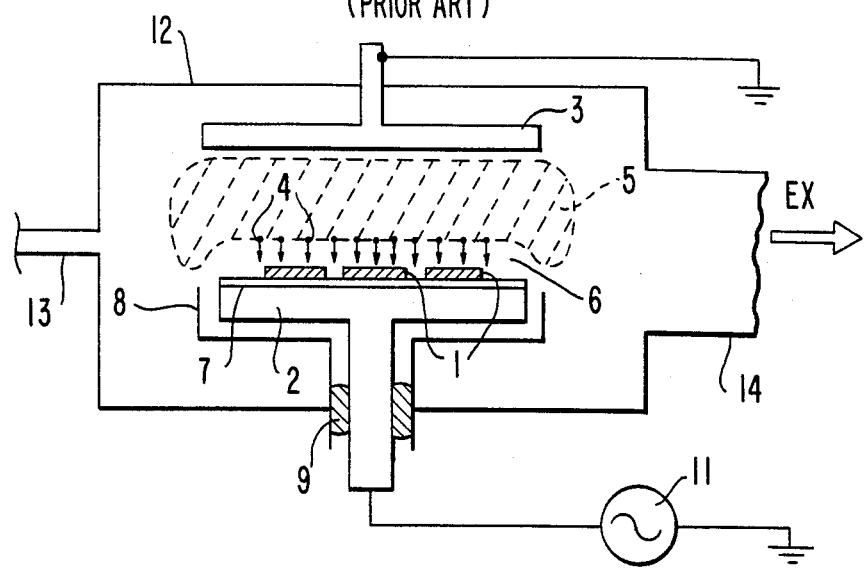
FIG. 1 is a schematic cross-sectional view illustrating a microwave reactive ion etching apparatus for explaining the underlying principles of the operation of microwave plasma etching.
Figure 3:
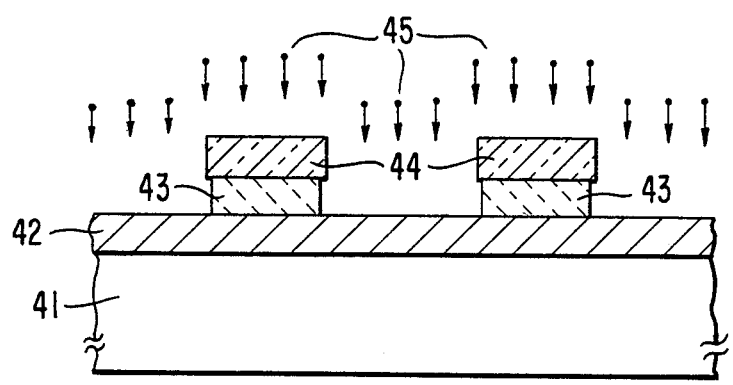
FIG. 3 is a magnified and partial cross-sectional view illustrating an IC substrate undergoing anisotropic etching.

By employing the microwave plasma etching apparatus shown in FIG. 2(a), substantially anisotorpic plasma etching can be performed, as described below with reference to FIG. 3. FIG. 3 is a schematic magnified cross-sectional view, illustrating a workpiece 41, for example, a silicon substrate, covered with a double layer, comprising an insulator layer 42 such as silicon dioxide ($SiO_2$) and a polysilicon mask 44. The workpiece 41 is mounted on a table of a plasma etching apparatus (not shown). Ions and radicals 45 impinge onto the surface of the substrate 41 and the regions of the polysilicon layer 43 where the mask 44 is not present are etched. The radicals and ions 45 have relatively low energy, that is, an inherent thermal energy sufficient to provide their initial velocity, and electrons generated in the plasma do not impinge on the substrate. As the result, the photoresist mask is free from damages such as carbonization and softening, which often occur with prior art plasma etching apparatus. Particularly, the silicon dioxide layer 43 lying under the mask 44 is not damaged by ion bombardment because the energy of the bombarding ions is low. Further, since the radicals impinge on the substrate 41 substantially perpendicularly to the surface, the side walls of the etched pattern are substantially perpendicular to the surface of the substrate. Such significantly anisotropic plasma etching enables the formation of a micro-pattern on the sub-micron (0.5 μm) order.

The shielding filter 38 will be described with reference to FIG. 2(a). Part of the microwave power which is not absorbed by the plasma might leak or propagate into the reaction chamber. The shielding filter 38 must stop the microwave power from entering the reaction chamber; otherwise, a new plasma is generated in the reaction chamber 40 and a cyclotron resonance corresponding to the magnetic field in the reaction chamber is created, thereby generating new radicals having uncontrollable random motion and adversely affecting the anisotropic plasma etching capability.

The shielding filter 38 is located behind the peak point Pm as viewed from the plasma 25, as shown in FIG. 2, and is not exposed to the plasma. This is because the electrons are reflected at the peak point Pm of the magnetic mirror before accessing the space adjacent to the shielding filter 38, and an ion sheath is not formed at the shielding filter 35.

Figure 4A:
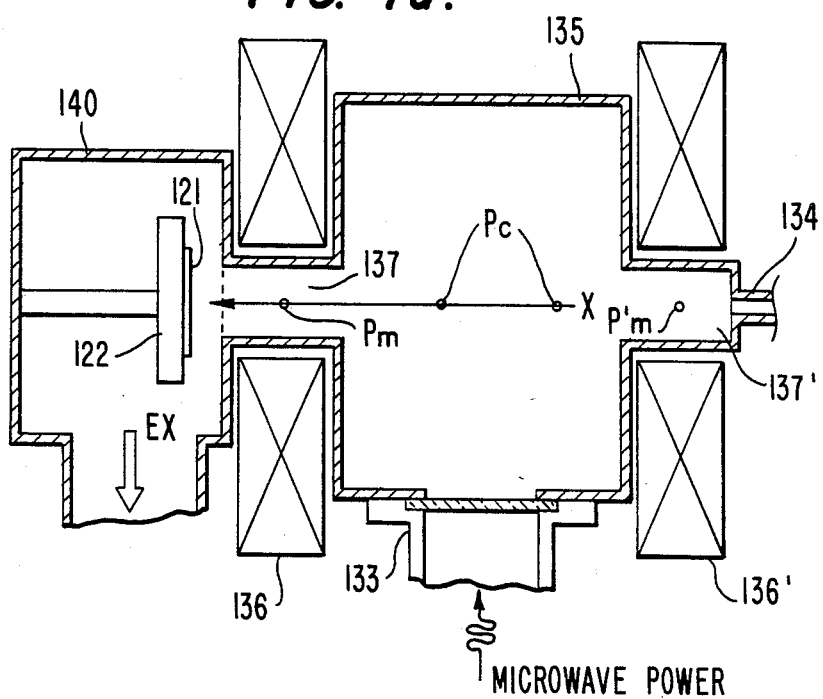
FIG. 4(a) is a schematic cross-sectional view illustrating another embodiment of the apparatus of the present invention.
Figure 4B:
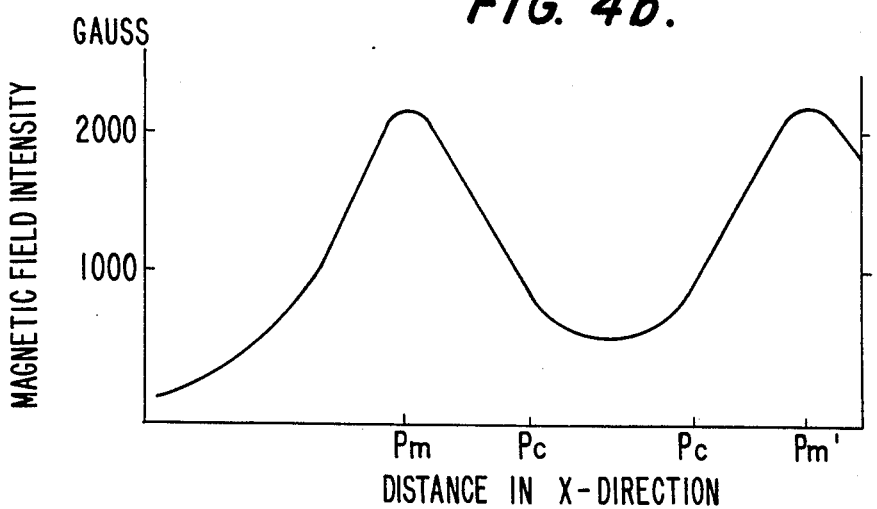
FIG. 4(b) is a diagram of a magnetic field intensity distribution along the X axis in the embodiment in FIG. 4(a).

FIG. 4(a) is a schematic cross-sectional view of a second embodiment of the present invention, wherein the plasma generating efficiency in the plasma chamber is further increased by an additional magnetic peak point Pm' of the magnetic mirror, as shown in FIG. 4(b). The additional peak point Pm' prevents charged particles in the plasma (electrons and ions) from being consumed by contacting the inner wall of the plasma chamber.

The second embodiment has a structure which is similar to the embodiment shown in FIG. 2(a). However, the profile of the magnetic field intensity distribution along the X-axis has two peak points, Pm and Pm'. The peak point Pm located amid the connecting chamber 137 plays the same role as that of the preceding embodiment. The additional peak point Pm' located in a sub-plasma chamber 135' located at the side of the plasma chamber 135 opposite from the connecting chamber 137, is created by a second solenoid 136' positioned outside the sub-plasma chamber 137. The magnetic field intensity distribution curve along the X-axis is shown in FIG. 4(b), wherein the ordinate is the magnetic field intensity and abscissa shows corresponding points along the X-axis. As can be seen from the graph in FIG. 4(b), the plasma chamber 135 is immersed in a magnetic field having a concave distribution profile along the X-axis. The concave distribution profile of the magnetic field confines the electrons to the central portion of the plasma chamber 135, and thus the electrons do not contact the inner walls of the plasma chamber 135. Consequently, the consumption of the electrons in the plasma is substantially reduced, increasing the plasma generating efficiency. The etching operation using the improved plasma etching apparatus of FIG. 4(a) is the same as that of the etching apparatus of FIG. 2(a), as shown in FIG. 3.

The present invention may be embodied in other specific forms without departing from the spirit or essential characteristics thereof. The disclosed embodiments are therefore to be considered to be illustrative and not restrictive, the scope of the invention being indicated by the appended claims, rather than the foregoing description. Therefore, all changes within the meaning and range of equivalency of the claims are to be embraced therein.

I claim:

1. A microwave plasma etching apparatus comprising:
 a vacuum vessel, filled with a gas having a predetermined pressure, including
  a plasma generating chamber,
  a reaction chamber,
  a connecting chamber for connecting said plasma generating chamber and said reaction chamber, the connecting chamber having an axis, and
  means, positioned in the reaction chamber, for holding a workpiece at a position in line with the axis of the connecting chamber and electrically isolating the workpiece;
 means for applying microwave power of a predetermined frequency to the plama generating chamber for generating therein a plasma, the plasma including ions, electrons and free radicals; and
 means for generating a magnetic field having a cyclotron resonance point in the plasma generating chamber for causing a cyclotron resonance of electrons in the plasma coresonding to the predetermined frequency of the microwave power, and having a peak point between said cyclotron resonance point and said workpiece at which said magnetic field intensity has a maximum value and functions as a magnetic mirror for reflecting the electrons in the plasma while allowing the free radicals and ions to pass the magnetic mirror along the axis of the connecting chamber to impinge on the workpiece, thereby to perform substantially anisotropic plasma etching of the workpiece.

2. A microwave plasma etching apparatus according to claim 1, wherein the frequency of the microwave power is approximately 2.45 GHz, the magnetic field intensity of the cyclotron resonance point approximately 875 Gauss, and the magnetic field intensity of the peak point is 1.5 KGauss to 2.5 KGauss.

3. A microwave plasma etching apparatus according to claim 1, wherein the magnetic field intensity of the peak point to the magnetic field intensity of the cyclotron resonance point have a ratio in the range of 2 to 3.

4. A microwave plasma etching apparatus according to claim 1, further comprising a shielding filter positioned between the peak point of the magnetic field and the reaction chamber for containing the microwave power in the plasma gnerating chamber and the connecting chamber, the shielding filter having a plurality of holes extending in parallel with the axis of the connecting chamber for allowing the passage of said radicals and ions generated in the plasma.

5. A microwave plasma etching apparatus according to claim 1, wherein the generating means comprises at least one solenoid.

6. A microwave plasma etching apparatus according to claim 4, wherein the plasma chamber, the connecting chamber, the reaction chamber, and the shielding filter are formed of aluminum.

7. A microwave plasma etching apparatus according to claim 1, wherein the predetermined pressure of the gas is less than approximately $10^{-3}$ Torr.

8. A microwave plasma etching apparatus according to claim 1, wherein the connecting chamber forms an aperature for collimating the free radicals and ions so that the free radicals and ions impinge the workpiece in a direction substantially perpendicular to the workpiece.

9. A microwave plasma etching apparatus according to claim 1, wherein the generating means is a means for generating an additional peak point of the magnetic field intensity located at the opposite side of the plasma chamber from the connecting chamber, for confining the the plasma to the central portion of the plasma generating chamber.

10. A microwave plasma etching apparatus according to claim 1, wherein the generating means is means for generating a magnetic field having a convex intensity profile along the axis of the connecting chamber.

11. A microwave plasma etching apparatus according to claim 1, further comprising a sub-plasma chamber in communication with plasma generating chamber, positioned at an end of the plasma generating chamber opposite from the connecting chamber, wherein the generating means is means for generating a magnetic field having an additional peak point of the magnetic field intensity in the sub-plasma chamber which functions as an additional magnetic mirror for reflecting the electrons, and an additional magnetic mirror for reflecting the electrons, and an additional cyclotron resonance point in the plasma generating chamber.

12. A microwave plasma etching apparatus according to claim 11, wherein the generating means is a means for generating a magnetic field having a concave intensity profile along the axis of the connecting chamber.

13. A microwave plasma etching apparatus according to claim 11, wherein the connecting chamber has a length in the direction of the axis of the connecting chamber and a width, and wherein the ratio of the length to the width is set so that the connecting chamber collimates particles traveling from the plasma generating chamber to the reaction chamber.

14. A microwave plasma etching apparatus, comprising:
   a plasma generating chamber filled to a predetermined pressure with an ionizable gas;
   means for applying microwave power to the plasma generating chamber to create a plasma in the ionizable gas, the plasma including ions, free radicals and electrons;
   a reaction chamber;
   connecting chamber means having an axis and connecting the plasma generating chamber and the reaction chamber for collimating ions and free radicals passing from the plasma generating chamber to the reaction chamber;
   means, positioned in the reaction chamber, for holding a workpiece at a predetermined position in line with the axis of the connecting chamber and electrically isolating the workpiece; and
   means for generating a magnetic field having a peak magnetic field intensity point at which the magnetic field functions as a magnetic mirror for containing electrons in the plasma in the plasma generating chamber, and having a cyclotron resonance point in the plasma generating chamber for imparting a cyclotron motion to the electrons in the plasma generating chamber.

15. A microwave plasma etching apparatus according to claim 14, wherein the generating means includes a solenoid positioned around the connecting means.

16. A microwave plasma etching apparatus according to claim 14, further comprising a sub-plasma chamber in communication with the plasma generating chamber at an end of the plasma generating chamber opposite from the connecting means, wherein the generating means is a means for generating a magnetic field having an additional peak magnetic field intensity point in the sub-plasma chamber which functions as an additional magnetic mirror for reflecting the electrons, and having an additional cyclotron resonance point in the plasma generating chamber for imparting a cyclotron motion to the elections in the plasma generating chamber.

17. A microwave plasma etching apparatus according to claim 16, wherein the generating means includes a first solenoid positioned to surround the connecting means and a second solenoid positioned to surround the sub-plasma chamber.

18. A method of anisotorpic plasma etching in a microwave plasma etching apparatus incuding a vacuum vessel having a plasma generating chamber, a reaction chamber, and a connecting chamber connecting the plasma generating chamber and the connecting chamber, the connecting chamber having an axis, comprising the steps of:
   (a) evacuating the vacuum vessel and back-filling the vacuum vessel with an ionizable gas;
   (b) applying microwave energy to the plasma generating chamber to generate a plasma; and
   (c) generating a magnetic field having a cyclotron resonance point in the plasma generating chamber for causing a cyclotron resonance of electrons in the plasma corresponding to the predetermined frequency of the microwave power, and having a peak point in the connecting chamber at which said magnetic field intensity has a maximum value and functions as a magnetic mirror for reflecting the electrons in the plasma while allowing the free radicals and ions to pass the magnetic mirror along the axis of the connecting chamber to impinge on the workpiece, thereby to perform substantially anisotropic plasma etching of the workpiece.

19. A method according to claim 18, wherein step (c) includes generating a magnetic field having a convex intensity profile along the axis of the connecting chamber.

20. A method according to claim 18, wherein step (a) includes backfilling the vaccum vessel to a pressure of approximately $1 \times 10^{-4}$ Torr.

21. A method according to claim 18, wherein step (c) includes generating a peak magnetic field intensity in the connecting chamber and generating a cyclotron resonance point in the plasma generating chamber.

22. A method according to claim 18, wherein step (c) includes generating a peak magnetic field intensity of approximately 1.5 to 2.5 KGauss and generating a magnetic field intensity of approximately 875 Gauss at the cyclotron resonance point.

23. A method according to claim 18, wherein step (b) includes applying microwave energy of 2.45 GHz.

24. A method according to claim 21, wherein step (c) includes generating the peak magnetic field intensity so that it is approximately 2 to 3 times larger than the magnetic field intensity of the cyclotron resonance point.

* * * * *

UNITED STATES PATENT AND TRADEMARK OFFICE
CERTIFICATE OF CORRECTION

PATENT NO. : 4,609,428
DATED : September 2, 1986
INVENTOR(S) : Fujimura

It is certified that error appears in the above-identified patent and that said Letters Patent is hereby corrected as shown below:

Col. 3, line 51, "4,192,1980" should be --4,192,706--.

Col. 4, line 17, "roles" should be --Roles--.

Col. 5, line 19, "after "energy" insert --in--;

line 48, "exceedes" should be --exceeds--.

Col. 6, line 36, "magentic" should be --magnetic--;

Col. 7, line 19, "magentic" should be --magnetic--;

Col. 9, line 17, "anisotorpic" should be --anisotropic--;

UNITED STATES PATENT AND TRADEMARK OFFICE
CERTIFICATE OF CORRECTION

PATENT NO. : 4,609,428      PAGE 2 of 2
DATED : September 2, 1986
INVENTOR(S) : Fujimura It is certified that error appears in the above-identified patent and that said Letters Patent is hereby corrected as shown below:

Col. 10, line 60, "corresonding" should be
--corresponding--.

Col. 11, line 17, "gnerating" should be --generating-.

lines 58-59, delete "additional magnetic mirror for reflecting the electrons, and".

Col. 12, line 50, "anisotorpic" should be
--anisotropic--.

Signed and Sealed this

Twenty-fifth Day of November, 1986

*Attest:*

DONALD J. QUIGG

*Attesting Officer*    *Commissioner of Patents and Trademarks*